US006897134B2

(12) United States Patent
Brask et al.

(10) Patent No.: US 6,897,134 B2
(45) Date of Patent: May 24, 2005

(54) METHOD FOR MAKING A SEMICONDUCTOR DEVICE HAVING A HIGH-K GATE DIELECTRIC

(75) Inventors: Justin K. Brask, Portland, OR (US); Mark L. Doczy, Beaverton, OR (US); John P. Barnak, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/748,090

(22) Filed: Dec. 29, 2003

(65) Prior Publication Data

US 2004/0185627 A1 Sep. 23, 2004

Related U.S. Application Data

(63) Continuation of application No. 10/391,816, filed on Mar. 18, 2003, now Pat. No. 6,696,327.

(51) Int. Cl.[7] ........................................... H01L 21/3205

(52) U.S. Cl. ...................... 438/585; 438/591; 438/633; 438/287

(58) Field of Search ................................. 438/585, 591, 438/633, 287

(56) References Cited

U.S. PATENT DOCUMENTS

| | | | |
|---|---|---|---|
| 5,625,217 A | 4/1997 | Chau et al. | |
| 5,783,478 A | 7/1998 | Chau et al. | |
| 5,891,798 A | 4/1999 | Doyle et al. | |
| 5,963,810 A | 10/1999 | Gardner et al. | |
| 6,027,976 A | 2/2000 | Gardner et al. | |
| 6,184,072 B1 | 2/2001 | Kaushik et al. | |
| 6,306,742 B1 | 10/2001 | Doyle et al. | |
| 6,420,279 B1 | 7/2002 | Ono et al. | |
| 6,436,777 B1 | 8/2002 | Ota | |
| 6,444,592 B1 * | 9/2002 | Ballantine et al. | 438/770 |
| 6,514,828 B2 | 2/2003 | Ahn et al. | |
| 6,544,906 B2 | 4/2003 | Rotondaro et al. | |
| 6,646,307 B1 * | 11/2003 | Yu et al. | 257/347 |
| 6,815,297 B1 * | 11/2004 | Krivokapic et al. | 438/287 |
| 2002/0197790 A1 | 12/2002 | Kizilyalli et al. | |
| 2003/0032303 A1 | 2/2003 | Yu et al. | |
| 2003/0045080 A1 | 3/2003 | Visokay et al. | |
| 2003/0178617 A1 * | 9/2003 | Appenzeller et al. | 257/20 |
| 2004/0235291 A1 * | 11/2004 | Mandal | 438/633 |

FOREIGN PATENT DOCUMENTS

EP  0 641 027 A  10/1999

OTHER PUBLICATIONS

Chih–Wei, Yang et al, "Dramatic Reduction of Gate Leakage Current in 1.61nm HfO2 High–K Dielectric Poly–silicon Gate with Al2O3 Capping Layers", Electronics Letters, vol. 38, No. 20, Sep. 2002, pp. 1223–1225, XP002288765.

Osten, H.J. et al., "Epitaxial, High–K Dielectrics on Silicon: The Example of Praseodymium Oxide", Microelectronics and Reliability, Elsevier Science Ltd, GB, vol. 41, 2001, pp. 991–994 XP002265638.

PCT International Search Report PCT/US 03/40688.

Doug Barlage et la. "High Frequency Responset of 100nm Integrated CMOS Transistors with High–K Gate Dielectrics", 2001 IEEE, 4 pages.

(Continued)

*Primary Examiner*—Matthew Smith
*Assistant Examiner*—Victor V Yevsikov
(74) *Attorney, Agent, or Firm*—Mark V. Seeley

(57) ABSTRACT

A method for making a semiconductor device is described. That method comprises forming a high-k gate dielectric layer on a substrate, then forming a capping layer on the high-k gate dielectric layer. After oxidizing the capping layer to form a capping dielectric oxide on the high-k gate dielectric layer, a gate electrode is formed on the capping dielectric oxide.

2 Claims, 1 Drawing Sheet

OTHER PUBLICATIONS

Robert S. Chau et al. "A 50NM Depleted–Substrate CMOS Transistor (DST)", 2001 IEEE, 4 pages.

"A Method of Making a Semiconductor Device Having a High–K Gate Dielectric", U.S. Appl. No. 10/082,530, filed Feb. 22, 2002.

"A Method of Making a Semiconductor Device Having a High–K Gate Dielectric", U.S. Appl. No. 10/285,915, filed Oct. 31, 2002.

"A Method of Making a Semiconductor Device Having a High–K Gate Dielectric", U.S. Appl. No. 10/288,043, filed Nov. 5, 2002.

"A Method of Making a Semiconductor Device Having a High–K Gate Dielectric", U.S. Appl. No. 10/315,268, filed Dec. 10, 2002.

"A Method of Making a Semiconductor Device Having a High–K Gate Dielectric", U.S. Appl. No. 10/338,174, filed Jan. 7, 2003.

"A Method of Making a Semiconductor Device Having a High–K Gate Dielectric", U.S. Appl. No. Unknown, filed Mar. 11, 2003.

* cited by examiner

US 6,897,134 B2

METHOD FOR MAKING A SEMICONDUCTOR DEVICE HAVING A HIGH-K GATE DIELECTRIC

This is a Continuation application of Ser. No. 10/391,816 filed Mar. 18, 2003, now U.S. Pat. No. 6,696,327.

FIELD OF THE INVENTION

The present invention relates to methods for making semiconductor devices, in particular, semiconductor devices that include high-k gate dielectric layers.

BACKGROUND OF THE INVENTION

MOS field-effect transistors with very thin silicon dioxide based gate dielectrics may experience unacceptable gate leakage currents. Forming the gate dielectric from certain high-k dielectric materials, instead of silicon dioxide, can reduce gate leakage. Such a dielectric may not, however, be compatible with polysilicon—the preferred material for making the device's gate electrode.

If such a high-k film comprises an oxide, it may manifest oxygen vacancies at random surface sites. When the device's gate electrode comprises polysilicon, a silicide may form where such vacancies occur. The silicide's presence may alter the electrode's workfunction or cause the device to short through the dielectric.

Accordingly, there is a need for an improved process for making a semiconductor device that includes a high-k gate dielectric. There is a need for such a process that eliminates (or at least minimizes) silicide formation, when a polysilicon gate electrode is formed on the high-k film. The method of the present invention provides such a process.

DETAILED DESCRIPTION OF THE PRESENT INVENTION

A method for making a semiconductor device is described. That method comprises forming on a substrate a high-k gate dielectric layer, then forming a capping layer on the high-k gate dielectric layer. After oxidizing the capping layer to form a capping dielectric oxide on the high-k gate dielectric layer, a gate electrode is formed on the capping dielectric oxide. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

Figure 1A:
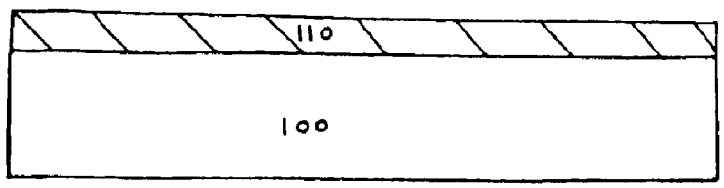
FIGS. 1a–1d represent cross-sections of structures that may be formed when carrying out an embodiment of the method of the present invention. Features shown in these figures are not intended to be drawn to scale.

In an embodiment of the method of the present invention, high-k gate dielectric layer 110 is formed on substrate 100, as shown in FIG. 1a. Substrate 100 may comprise a bulk silicon or silicon-on-insulator substructure. Alternatively, substrate 100 may comprise other materials—which may or may not be combined with silicon—such as: germanium, indium antimonide, lead telluride, indium arsenide, indium phosphide, gallium arsenide, or gallium antimonide. Although several examples of materials from which substrate 100 may be formed are described here, any material that may serve as a foundation upon which a semiconductor device may be built falls within the spirit and scope of the present invention.

When substrate 100 comprises a silicon wafer, the wafer may be cleaned before forming high-k gate dielectric layer 110 on its surface. To clean the wafer, it may initially be exposed to a dilute hydrofluoric acid ("HF") solution, e.g., a 50:1 water to HF solution. The wafer may then be placed in a megasonic tank, and exposed first to a water/$H_2O_2$/$NH_4OH$ solution, then to a water/$H_2O_2$/HCl solution. The water/$H_2O_2$/$NH_4OH$ solution may remove particles and organic contaminants, and the water/$H_2O_2$/HCl solution may remove metallic contaminants.

After that cleaning treatment, high-k gate dielectric layer 110 may be formed on substrate 100, generating the FIG. 1a structure. High-k gate dielectric layer 110 comprises a material with a dielectric constant that is greater than the dielectric constant of silicon dioxide. Dielectric layer 110 preferably has a dielectric constant that is at least about twice that of silicon dioxide, i.e., a dielectric constant that is greater than about 8. Materials that may be used to make high-k gate dielectrics include: hafnium oxide, hafnium silicon oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, titanium oxide, and aluminum oxide. Although a few examples of materials that may be used to form dielectric layer 110 are described here, that layer may be made from other materials that serve to reduce gate leakage.

High-k gate dielectric layer 110 may be formed on substrate 100 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and dielectric layer 110. The CVD reactor should be operated long enough to form a layer with the desired thickness. In most applications, dielectric layer 110 should be less than about 60 angstroms thick, and more preferably between about 5 angstroms and about 40 angstroms thick.

As deposited, high-k gate dielectric layer 110 may be incompatible with polysilicon due to the presence of oxygen vacancies where a silicide may form. In the method of the present invention, a capping dielectric oxide is formed on high-k gate dielectric layer 110 to render that layer compatible with polysilicon, or other materials that may be used to form the gate electrode.

Figure 1B:
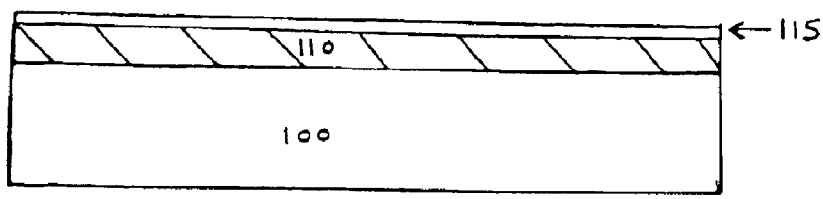

A capping dielectric oxide may be formed on high-k gate dielectric layer 110 by forming a capping layer on layer 110, then oxidizing that capping layer. FIG. 1b reflects a cross-section of a structure in which capping layer 115 has been formed on high-k gate dielectric layer 110. In a preferred embodiment, capping layer 115 comprises silicon, although other materials, e.g., aluminum, may be used instead. Capping layer 115 preferably is less than about five monolayers thick, and more preferably consists of only one or two monolayers. Capping layer 115 may be formed using a conventional physical vapor deposition process (e.g., by sputtering one to five monolayers of silicon, or another material, onto the surface of high-k gate dielectric layer 110).

When high-k gate dielectric layer 110 comprises a metal oxide, oxygen vacancies—i.e., surface sites where hydroxyl group termination has been depleted—may exist. Forming capping layer 115 on layer 110 by sputtering a thin layer of silicon onto the surface of layer 110 may saturate such surface sites with silicon, which may cause a silicide to form at all (or at least most) of those surface sites. For example, if layer 110 comprises hafnium oxide, then forming a thin layer of silicon on that oxide will cause hafnium-silicon bonds to form, where oxygen vacancies occur in the hafnium oxide film.

After forming capping layer 115 on high-k gate dielectric layer 110, capping layer 115 is oxidized to form capping dielectric oxide 125 on high-k gate dielectric layer 110. Capping dielectric oxide 125 will serve as an ultra-thin protective oxide layer that prevents silicide formation, when a polysilicon layer is formed on capping dielectric oxide 125. When capping layer 115 comprises silicon, capping dielectric oxide 125 may comprise an ultra-thin layer of silicon dioxide.

Capping layer 115 may be oxidized using a plasma enhanced chemical vapor deposition process or by exposing the capping layer to a solution that comprises an oxidizing agent. When using a plasma enhanced chemical vapor deposition process to oxidize capping layer 115, a direct plasma enhanced chemical vapor deposition ("PECVD") process or a remote plasma enhanced chemical vapor deposition ("RPECVD") process may be used. In such a PECVD or RPECVD process, capping layer 115 may be oxidized by exposing it to ionized oxygen species generated by a plasma source. When a PECVD process is used, such ionized oxygen species may be generated, for example, by feeding oxygen, nitrous oxide or a mixture of oxygen and nitrous oxide into the reactor, then striking a plasma within the reactor. When a RPECVD process is used, the plasma may be stricken remotely, and then the resulting ionized oxygen species may be fed into the reactor. Alternatively, ionized oxygen species may be created by striking a plasma remotely using a carrier gas, e.g., argon or helium, feeding the resulting ionized components into the reactor, then feeding oxygen, nitrous oxide or a mixture of oxygen and nitrous oxide into the reactor—downstream from the plasma source.

The reactor should be operated under the appropriate conditions (e.g., pressure, radio frequency, and power) for a sufficient time to oxidize at least those portions of capping layer 115 that have bonded to portions of high-k gate dielectric layer 110. For example, when capping layer 115 comprises silicon, then the oxidation step should oxidize all of the silicide. That oxidation step may also oxidize any portion of capping layer 115 that did not bond to metal atoms present in layer 110. At each surface site where a silicide has formed, such an oxidation step may introduce a bridging oxygen atom between the silicon atom (which formed the silicide) and the metal atom from the high-k film to which the silicon atom had been bonded.

In a preferred embodiment, that oxidation step takes place at a relatively low temperature, e.g., at a temperature that is less than about 500° C. By oxidizing capping layer 115 at a relatively low temperature, the high-k gate dielectric layer may retain its amorphous state, and the amount of oxygen that diffuses to the interface between substrate 100 and layer 110 may be reduced. This, in turn, may limit the amount of additional oxide growth at that interface.

As an alternative to oxidizing capping layer 115 using a plasma enhanced chemical vapor deposition process, capping layer 115 may be oxidized by exposing that layer to a solution that comprises an oxidizing agent. In a preferred embodiment, the oxidizing agent comprises hydrogen peroxide. When capping layer 115 is exposed to a hydrogen peroxide based solution, an aqueous solution that contains between about 2% and about 30% hydrogen peroxide by volume may be used. That exposure step should take place at between about 15° C. and about 40° C. for at least about one minute. In a particularly preferred embodiment, capping layer 115 is exposed to an aqueous solution that contains about 6.7% $H_2O_2$ by volume for about 10 minutes at a temperature of about 25° C.

When capping layer 115 is oxidized by exposing it to a solution that comprises hydrogen peroxide, it may be desirable to simultaneously apply sonic energy at a frequency of between about 10 KHz and about 2,000 KHz, while dissipating at between about 1 and about 10 watts/$cm^2$. In a preferred embodiment, sonic energy may be applied at a frequency of about 1,000 KHz, while dissipating at about 5 watts/$cm^2$.

Figure 1C:
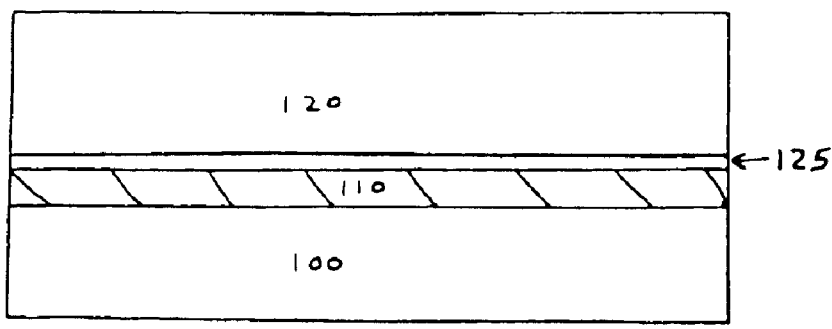
Figure 1D:
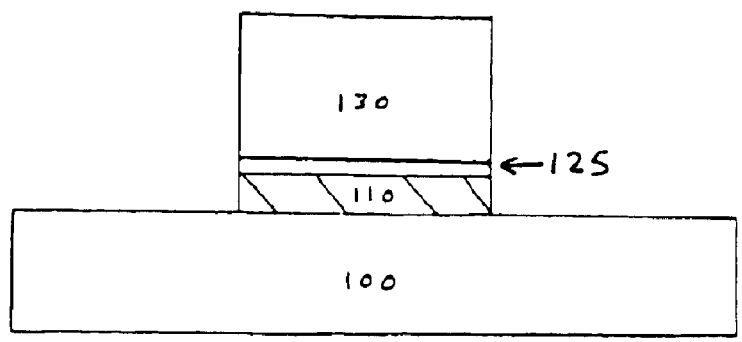

After oxidizing capping layer 115 to form capping dielectric oxide 125, a gate electrode is formed on oxide 125. In a preferred embodiment, the gate electrode may be formed by initially depositing polysilicon layer 120 on capping dielectric oxide 125—generating the FIG. 1c structure. Polysilicon layer 120 may be deposited using conventional methods and preferably is between about 500 angstroms and about 4,000 angstroms thick. After etching layers 120, 125 and 110 to form the FIG. 1d structure, using conventional techniques, additional steps that are generally used to complete the gate electrode (e.g., forming a silicide (not shown) on the upper part of etched polysilicon structure 130) may be applied. As such steps are well known to those skilled in the art, they will not be described in more detail here.

Prior to forming capping layer 115 on high-k gate dielectric layer 110, it may be desirable to apply a wet chemical treatment to layer 110 to remove impurities from that layer and to increase the oxygen content of that layer. Such a wet chemical treatment may comprise exposing high-k gate dielectric layer 110 to a solution that comprises a source of hydroxide. That solution preferably has a pH of at least about 7, and more preferably a pH of between about 11 and about 13. The source of hydroxide may comprise, for example, deionized water, hydrogen peroxide, ammonium hydroxide, and/or a tetraalkyl ammonium hydroxide, such as tetramethyl ammonium hydroxide ("TMAH").

When high-k gate dielectric layer 110 is exposed to a solution that consists essentially of deionized water, high-k gate dielectric layer 110 should be exposed to such a solution for at least about one minute at a temperature of at least about 35° C. In a particularly preferred embodiment, high-k gate dielectric layer 110 may be exposed to such a solution for about 20 minutes at a temperature of about 40° C.

When high-k gate dielectric layer 110 is exposed to a hydrogen peroxide based solution, an aqueous solution that contains between about 2% and about 30% hydrogen peroxide by volume may be used. That exposure step should take place at between about 15° C. and about 40° C. for at least about one minute. In a particularly preferred embodiment, high-k gate dielectric layer 110 is exposed to an aqueous solution that contains about 6.7% $H_2O_2$ by volume for about 10 minutes at a temperature of about 25° C.

When high-k gate dielectric layer 110 is exposed to an ammonium hydroxide based solution, an aqueous solution that contains between about 2% and about 30% ammonium hydroxide by volume may be used. That exposure step should take place at between about 15° C. and about 90° C. for at least about one minute. In a particularly preferred embodiment, high-k gate dielectric layer 110 is exposed to an aqueous solution that contains about 15% $NH_4OH$ by volume for about 30 minutes at a temperature of about 25° C.

When high-k gate dielectric layer 110 is exposed to a hydrogen peroxide/ammonium hydroxide based solution, an aqueous solution that contains between about 1% and about 10% hydrogen peroxide by volume, and between about 1% and about 10% ammonium hydroxide by volume, may be used. That exposure step should take place at between about 15° C. and about 40° C. for at least about one minute. In a particularly preferred embodiment, high-k gate dielectric layer 110 is exposed to an aqueous solution that contains about 4.2% $H_2O_2$ by volume and about 4.2% $NH_4OH$ by volume for about 10 minutes at a temperature of about 25° C.

When high-k gate dielectric layer 110 is exposed to a TMAH based solution, an aqueous solution that contains between about 2% and about 30% TMAH by volume may be used. That exposure step should take place at between about 15° C. and about 90° C. for at least about one minute. In a particularly preferred embodiment, high-k gate dielectric layer 110 is exposed to an aqueous solution that contains about 25% TMAH by volume for about 2 minutes at a temperature of about 80° C.

While high-k gate dielectric layer 110 is exposed to a solution that comprises a source of hydroxide, it may be desirable to apply sonic energy at a frequency of between about 10 KHz and about 2,000 KHz, while dissipating at between about 1 and about 10 watts/cm². In a preferred embodiment, sonic energy may be applied at a frequency of about 1,000 KHz, while dissipating at about 5 watts/cm².

Although a few examples of wet chemical treatments that may be used to remove impurities from high-k gate dielectric layer 110, and to increase that layer's oxygen content, are described here, other treatments that serve to modify high-k gate dielectric layer 110 in that way may be used instead, as will be apparent to those skilled in the art. Examples include exposing high-k gate dielectric layer 110 to aqueous solutions that contain ozone, or to other solutions that contain other types of oxidizing and/or hydrolyzing agents. When a wet chemical treatment is applied to high-k gate dielectric layer 110 prior to forming capping layer 115, it may be desirable to use the same process to oxidize the capping layer as was used to treat layer 110.

The method of the present invention may enable a high-k gate dielectric to be used with a polysilicon based gate electrode. By forcing silicide formation on surface sites of high-k gate dielectric layer 110 where oxygen vacancies occur, then converting the resulting silicide to an oxide prior to forming the polysilicon based gate electrode, the resulting device's electrical properties may be enhanced.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a semiconductor device comprising:
    forming on a substrate a high-k gate dielectric layer;
    applying a wet chemical treatment to the high-k gate dielectric layer to remove impurities from that layer and to increase the oxygen content of that layer;
    forming a capping layer that comprises silicon and that is less than about five monolayers thick on the high-k gate dielectric layer;
    oxidizing the capping layer by exposing the capping layer to a solution that comprises hydrogen peroxide to form a capping dielectric oxide on the high-k gate dielectric layer; and then
    forming a gate electrode on the capping dielectric oxide.

2. A method for making a semiconductor device comprising:
    forming a high-k gate dielectric layer on a substrate, the high-k gate dielectric layer being less than about 60 angstroms thick and comprising a material selected from the group consisting of hafnium oxide, zirconium oxide, titanium oxide, and aluminum oxide;
    applying a wet chemical treatment to the high-k gate dielectric layer to remove impurities from that layer and to increase the oxygen content of that layer;
    forming on the high-k gate dielectric layer a silicon containing layer that is less than about five monolayers thick;
    oxidizing the silicon containing layer to form a silicon dioxide layer on the high-k gate dielectric layer; and
    forming a gate electrode on the silicon dioxide layer.

* * * * *